United States Patent
Rim et al.

(10) Patent No.: US 9,524,772 B2
(45) Date of Patent: Dec. 20, 2016

(54) MEMORY DEVICE OF A SINGLE-ENDED BITLINE STRUCTURE INCLUDING REFERENCE VOLTAGE GENERATOR

(71) Applicant: Samsung Electronics Co., Ltd., Suwon-si, Gyeonggi-do (KR)

(72) Inventors: Woojin Rim, Seoul (KR); Taejoong Song, Seongnam-si (KR); Gyuhong Kim, Seoul (KR); Jongsun Park, Seoul (KR); Woong Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/793,053

(22) Filed: Jul. 7, 2015

(65) Prior Publication Data

US 2016/0042785 A1 Feb. 11, 2016

(30) Foreign Application Priority Data

Aug. 11, 2014 (KR) .......................... 10-2014-0103774

(51) Int. Cl.
| | |
|---|---|
| G11C 5/06 | (2006.01) |
| G11C 7/06 | (2006.01) |
| G11C 5/14 | (2006.01) |
| G11C 7/02 | (2006.01) |
| G11C 8/00 | (2006.01) |
| G11C 11/419 | (2006.01) |
| G11C 11/412 | (2006.01) |
| G11C 7/12 | (2006.01) |

(52) U.S. Cl.
CPC ............ *G11C 11/419* (2013.01); *G11C 11/412* (2013.01); *G11C 7/12* (2013.01); *G11C 2207/002* (2013.01)

(58) Field of Classification Search
USPC ........... 365/154, 156, 185.2, 189.07, 189.09, 365/205, 207, 208, 210.1, 230.03, 63, 365/230.05
See application file for complete search history.

(56) References Cited

U.S. PATENT DOCUMENTS

| | | | | |
|---|---|---|---|---|
| 5,148,397 A | * | 9/1992 | Kokubun ............... | G11C 16/28 365/189.09 |
| 5,386,388 A | * | 1/1995 | Atwood ................. | G11C 16/28 365/185.2 |
| 6,373,753 B1 | * | 4/2002 | Proebsting ............. | G11C 5/145 365/189.09 |
| 7,054,212 B2 | | 5/2006 | Terzioglu et al. | |

(Continued)

FOREIGN PATENT DOCUMENTS

| | | |
|---|---|---|
| KR | 2006072515 | 6/2006 |
| KR | 100604946 | 7/2006 |

(Continued)

*Primary Examiner* — Trong Phan
(74) *Attorney, Agent, or Firm* — Onello & Mello, LLP

(57) ABSTRACT

A memory device includes a first memory cell array including memory cells of a single-ended bitline structure, a second memory cell array including memory cells of a single-ended bitline structure, a reference voltage generator configured to output a bitline voltage of a selected one of the first and second memory cell arrays as a sensing voltage according to an array select signal and output a bitline voltage of an unselected memory cell array as a reference voltage, and a differential sense amplifier configured to amplify and output a difference between the sensing voltage and the reference voltage. Logic states of the sensing voltage and the reference voltage are complementary to each other.

20 Claims, 11 Drawing Sheets

(56) References Cited

U.S. PATENT DOCUMENTS

| | | |
|---|---|---|
| 7,200,041 B2 | 4/2007 | Marotta et al. |
| 7,324,395 B2 | 1/2008 | Jeong et al. |
| 7,548,469 B2 | 6/2009 | Lee et al. |
| 7,561,464 B2 | 7/2009 | Toda |
| 7,768,321 B2 | 8/2010 | Chang et al. |
| 7,864,588 B2 * | 1/2011 | Betser ................ G11C 16/0475 365/185.2 |
| 7,894,241 B2 | 2/2011 | Lee et al. |
| 8,144,537 B2 | 3/2012 | Mishra et al. |
| 8,154,936 B2 * | 4/2012 | Dhori ...................... G11C 7/08 365/185.2 |
| 8,422,316 B2 | 4/2013 | Kajigaya |
| 8,553,484 B2 | 10/2013 | Kim et al. |
| 8,638,621 B2 | 1/2014 | Son et al. |
| 2005/0041469 A1 | 2/2005 | Marotta et al. |
| 2005/0122246 A1 | 6/2005 | Terzioglu et al. |
| 2007/0047350 A1 | 3/2007 | Jeong et al. |
| 2007/0153612 A1 | 7/2007 | Lee et al. |
| 2008/0198654 A1 | 8/2008 | Toda |
| 2009/0147559 A1 | 6/2009 | Lee et al. |
| 2010/0039173 A1 | 2/2010 | Chang et al. |
| 2010/0165755 A1 | 7/2010 | Dhori |
| 2010/0172199 A1 | 7/2010 | Mishra et al. |
| 2011/0188325 A1 | 8/2011 | Kajigaya |
| 2012/0087177 A1 | 4/2012 | Kim et al. |
| 2012/0230139 A1 | 9/2012 | Son et al. |

FOREIGN PATENT DOCUMENTS

| | | |
|---|---|---|
| KR | 100727411 | 6/2007 |
| KR | 101093070 | 12/2011 |
| KR | 2012037528 | 4/2012 |
| KR | 101163033 | 7/2012 |
| KR | 101338384 | 12/2013 |

* cited by examiner

MEMORY DEVICE OF A SINGLE-ENDED BITLINE STRUCTURE INCLUDING REFERENCE VOLTAGE GENERATOR

CROSS-REFERENCE TO RELATED APPLICATIONS

This U.S. non-provisional patent application claims priority under 35 USC §119 to Korean Patent Application No. 10-2014-0103774, filed on Aug. 11, 2014, the contents of which are herein incorporated by reference in their entirety.

BACKGROUND

Technical Field

Embodiments of the present inventive concepts relate to semiconductor memory devices and, more particularly, to a semiconductor memory devices including a reference voltage generator.

Discussion of Related Art

During a read operation, a memory device including memory cells of a single-ended bitline structure requires that a differential sense amplifier compare a data voltage output from the single-ended bitline and a reference voltage. Thus, an additional reference voltage generator is required to provide the reference voltage.

In general, various circuits such as a band gap reference (BGR), a control circuit, and voltage generation circuit are required to implement a reference voltage generator. This results in an increase in power consumption of a memory device and an increase in chip area.

SUMMARY OF THE INVENTION

The present inventive concepts provide a memory device including a reference voltage generator.

According to an aspect of the present inventive concepts, there is provided a memory device. The memory device may include a first memory cell array including memory cells of a single-ended bitline structure; a second memory cell array including memory cells of a single-ended bitline structure; a reference voltage generator configured to output a bitline voltage of a selected one of the first and second memory cell arrays as a sensing voltage according to an array select signal and to output a bitline voltage of an unselected memory cell array as a reference voltage; and a differential sense amplifier configured to amplify and output a difference between the sensing voltage and the reference voltage. Logic states of the sensing voltage and the reference voltage may be complementary to each other.

In some embodiments, the reference voltage generator adjusts a level of the reference voltage according to a level of the bitline voltage of the selected memory cell array.

In some embodiments, the array select signal includes a first select signal indicating whether the first memory cell array is selected and a second select signal indicating whether the second memory cell array is selected, and logic states of the first and second select signals are complementary to each other.

In some embodiments, the reference voltage generator includes a first voltage output unit configured to output the bitline voltage of the first memory cell array as a sensing voltage or a reference voltage according to the first select signal and the bitline voltage of the second memory cell array; and a second voltage output unit configured to output the bitline voltage of the second memory cell array as a sensing voltage or a reference voltage according to the second select signal and the bitline voltage of the first memory cell array.

In some embodiments, the first voltage output unit outputs the bitline voltage of the first memory cell array as a sensing voltage and the second voltage output unit outputs the bitline voltage of the second memory cell array as a reference voltage when the first select signal is logic high.

In some embodiments, the first voltage output unit outputs the bitline voltage of the first memory cell array as a reference voltage and the second voltage output unit outputs the bitline voltage of the second memory cell array as a sensing voltage when the second select signal is logic high.

In some embodiments, the first voltage output unit includes a first pull-down transistor and a second pull-down transistor that are connected in series and configured to drive the bitline voltage of the first memory cell array to a ground voltage level in response to the first select signal and the bitline voltage of the second memory cell array.

In some embodiments, the second voltage output unit includes a third pull-down transistor and a fourth pull-down transistor that are connected in series and configured to drive the bitline voltage of the second memory cell array to a ground voltage level in response to the second select signal and the bitline voltage of the first memory cell array.

In some embodiments, a multiplexer is configured to output a data signal corresponding to a logic state of data stored in the selected memory cell in response to an output signal of the differential sense amplifier and the first and second select signals.

According to another aspect of the present inventive concepts, there is provided a memory device of an open bitline structure. The memory device may include an upper memory cell array including memory cells of a single-ended bitline structure; a lower memory cell array including memory cells of a single-ended bitline structure; an address decoder configured to output an array select signal selecting one of the upper and lower memory cell arrays in response to an address signal; a reference voltage generator configured to output a bitline voltage of a selected memory cell array as a sensing voltage and to output a bitline voltage of an unselected memory cell array as a reference voltage according to the array select signal; and a differential sense amplifier configured to amplify and output a difference between the sensing voltage and the reference voltage. Logic states of the sensing voltage and the reference voltage may be complementary to each other.

In some embodiments, the reference voltage generator adjusts a level of the reference voltage according to a level of the bitline voltage of the selected memory cell array.

In some embodiments, the address decoder outputs an upper select signal indicating whether the upper memory cell array is selected and a lower select signal indicating whether the lower memory cell array is selected, and logic states of the upper and lower select signals are complementary to each other.

In some embodiments, the reference voltage generator includes a first voltage output unit configured to output the bitline voltage of the upper memory cell array as a sensing voltage or a reference voltage according to the upper select signal and the bitline voltage of the lower memory cell array, and a second voltage output unit configured to output the bitline voltage of the lower memory cell array as a sensing voltage or a reference voltage according to the lower select signal and the bitline voltage of the upper memory cell array.

In some embodiments, the first voltage output unit outputs the bitline voltage of the upper memory cell array as a sensing voltage when the upper select signal is logic high and outputs a logic-high or logic-low reference voltage according to a level of the bitline voltage of the lower memory cell array when the upper select signal is logic low.

In some embodiments, the second voltage output unit outputs the bitline voltage of the lower memory cell array as a sensing voltage when the lower select signal is logic high and outputs a logic-high or logic-low reference voltage according to a level of the bitline voltage of the upper memory cell array when the lower select signal is logic low.

According to another aspect of the present inventive concepts, there is provided a memory device. The memory device may include a first memory cell array including memory cells of a single-ended bitline structure and a dummy bitline; a second memory cell array including memory cells of a single-ended bitline structure and a dummy bitline; a reference voltage generator configured to output a bitline voltage of a selected one of the first and second memory cell arrays as a sensing voltage according to an array select signal and outputs a dummy bitline voltage of an unselected memory cell array as a reference voltage; and a differential sense amplifier configured to amplify and output a difference between the sensing voltage and the reference voltage. Logic states of the sensing voltage and the reference voltage may be complementary to each other.

wherein the dummy bitline is precharged to a precharge voltage level before a voltage level of the dummy bitline is adjusted according to the array select signal and the bitline voltage of the selected memory cell array.

In some embodiments, the array select signal includes a first select signal indicating whether the first memory cell array is selected and a second select signal indicating whether the second memory cell array is selected, and logic states of the first and second select signals are complementary to each other.

In some embodiments, a multiplexer configured to output a data signal corresponding to a logic state of data stored in the selected memory cell in response to an output signal of the different sense amplifier and the first and second select signals.

In some embodiments, the multiplexer includes a first NAND gate configured to receive and logically operate a first output signal of the differential sense amplifier and the second select signal to output a logic output signal, a second NAND gate configured to receive and logically operate a second output signal of the differential sense amplifier and the first select signal to output a logic output signal, and a third NAND gate configured to receive and logically operate the logic output signals of the first and second NAND gates to output a data signal.

According to another aspect of the present inventive concepts, there is provided a memory device. The memory device includes a first memory cell array comprising memory cells of a single-ended bitline structure and configured to output a first bitline voltage, and a second memory cell array comprising memory cells of a single-ended bitline structure and configured to output a second bitline voltage. The memory device further includes a reference voltage generator configured to output a selected one of the first and second bitline voltages as a sensing voltage according to an array select signal and to output the other of the first and second bitline voltages as a reference voltage after adjusting the bitline voltage of the other of the first and second bitline voltages according to the selected one of the first and second bitline voltages. The memory device further includes a differential sense amplifier configured to amplify and output a difference between the sensing voltage and the reference voltage.

In some embodiments, logic states of the sensing voltage and the reference voltage are complementary to each other.

In some embodiments, the array select signal includes a first select signal indicating whether the first memory cell array is selected and a second select signal indicating whether the second memory cell array is selected, and wherein logic states of the first and second select signals are complementary to each other.

In some embodiments, the reference voltage generator includes a first voltage output unit configured to output the first bitline voltage as a sensing voltage or a reference voltage according to the first select signal and the second bitline voltage, and a second voltage output unit configured to output the second bitline voltage as a sensing voltage or a reference voltage according to the second select signal and the first bitline voltage.

In some embodiments, the first voltage output unit outputs the first bitline voltage as a sensing voltage when the first select signal is logic high and outputs a logic-high or logic-low reference voltage according to a level of the second bitline voltage when the first select signal is logic low, and the second voltage output unit outputs the second bitline voltage as a sensing voltage when the second select signal is logic high and outputs a logic-high or logic-low reference voltage according to a level of the first bitline voltage when the lower select signal is logic low.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION

Figure 1:
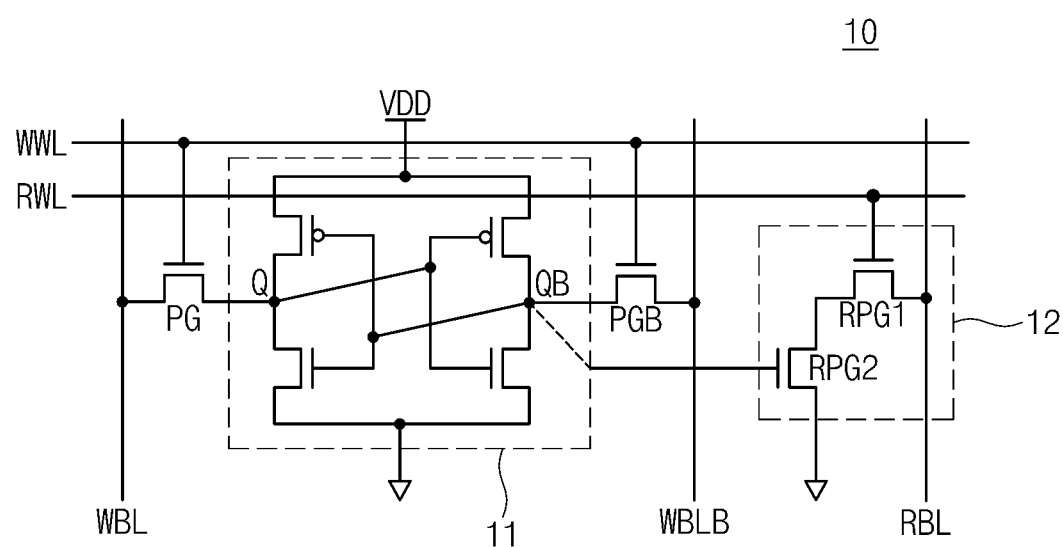
FIG. 1 is a circuit diagram of a memory cell of a 2-port SRAM according to an example embodiment of the present inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 is a circuit diagram of a memory cell of a 2-port SRAM 10. Since the 2-port SRAM 10 includes eight transistors, it is also called an 8T SRAM. As illustrated, the 2-port SRAM 10 includes a latch circuit 11, pass gates PG and PGB, and a read buffer 12. The read buffer 12 includes read pass gates RPG1 and RPG2. Data nodes Q and QB of the latch circuit 11 store a single bit of data. Since simultaneous multiple access to a 2-port SRAM memory cell 10 is possible, the 2-port SRAM memory cell 10 is essential for a graphic processor unit (GPU) that requires high operating speed.

Hereinafter, write and read operations of the 2-port SRAM memory cell 10 will be described below.

First, the write operation will be described. A write wordline WWL is enabled by a write wordline enable signal. When the write wordline WWL is enabled, the pass gates PG and PGB are turned on. A write driver (not shown) applies a write voltage corresponding to data which are desired to be stored to write bitlines WBL and WBLB. The applied write voltage changes a voltage level of each of the data nodes Q and QB to a desired logic state to complete the write operation.

Next, the read operation will be described. A read bitline RBL is precharged to a precharge voltage level. A read wordline RWL is enabled by a read wordline enable signal. When the read wordline RWL is enabled, a read pass gate RPG1 of the read buffer 12 is turned on. A read pass gate RPG2 of the read buffer 12 is turned on or off according to a logic state of data stored in the data node QB. For example, when the data stored in the data node QB is logic 'high', the read pass gate RPG2 is turned on. Alternatively, when the data stored in the data node QB is logic 'low', the read pass gate RPG2 is turned off. A current path between the read bitline RBL and a ground terminal is formed or blocked according to the turn-on or turn-off operation of the read pass gate RPG2. As a result, a voltage level of the precharged read bitline RBL changes or does not change according to a logic state of the data stored in the data node QB.

Figure 2A:
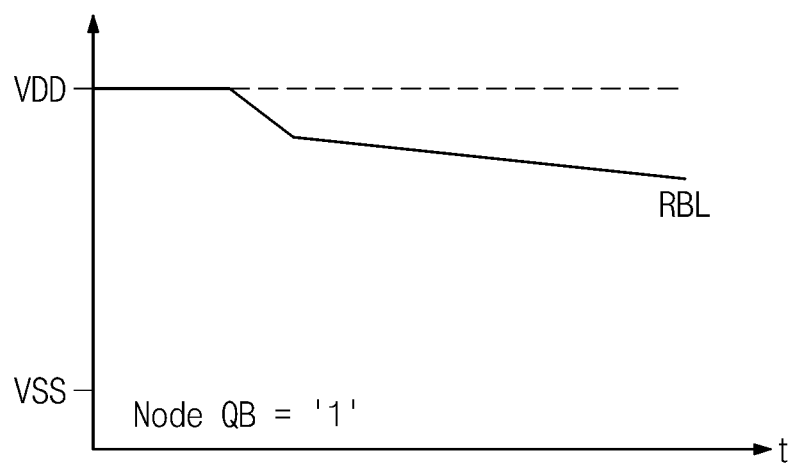
FIGS. 2A and 2B are graphs illustrating a change of a voltage level of a read bitline based on data stored in a data node of the memory cell of FIG. 1.
Figure 2B:
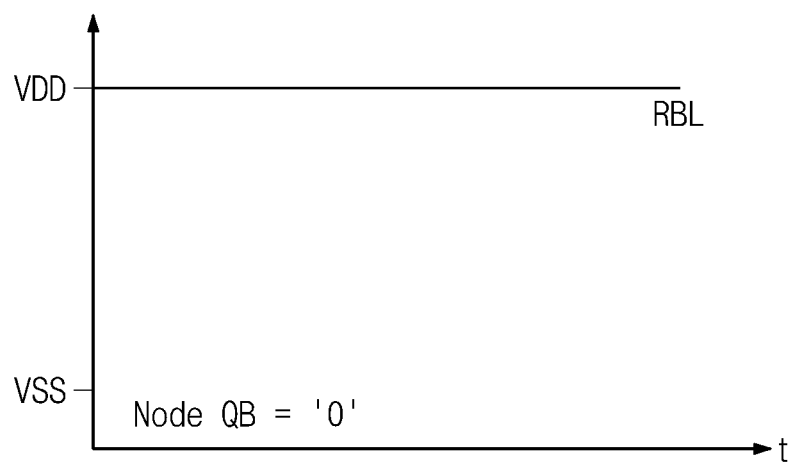

FIGS. 2A and 2B are graphs illustrating a change of a voltage level of a read bitline based on a logic state of a data node, for example, data node QB over a time t. FIG. 2A illustrates an embodiment in which a logic state of the data node QB is '1', and FIG. 2B illustrates an embodiment in which a logic state of the data node QB is '0'.

Referring to FIG. 2A, when the logic state of the data stored in the data node QB is '1', the read pass gate RPG2 is turned on. Thus, a voltage level of the read bitline RBL decreases from a precharge voltage level VDD. Referring to FIG. 2B, when the logic state of the data stored in the data node QB is '0', the read pass gate RPG2 is turned off. Thus, a voltage level of the read bitline RBL is maintained at a precharge voltage level VDD.

The above-mentioned 2-port SRAM memory cell 10 includes a single read bitline RBL. Therefore, a reference signal is additionally needed as an input signal of a differential sense amplifier during a read operation. A memory device according to the inventive concepts includes a reference voltage generator that may be applied to memory devices each including a single bitline memory cell. The 2-port SRAM memory cell 10 is a single-ended bitline structure. Hereinafter, a memory device including a 2-port SRAM memory cell 10 illustrated in FIG. 1 will be described.

Figure 3:
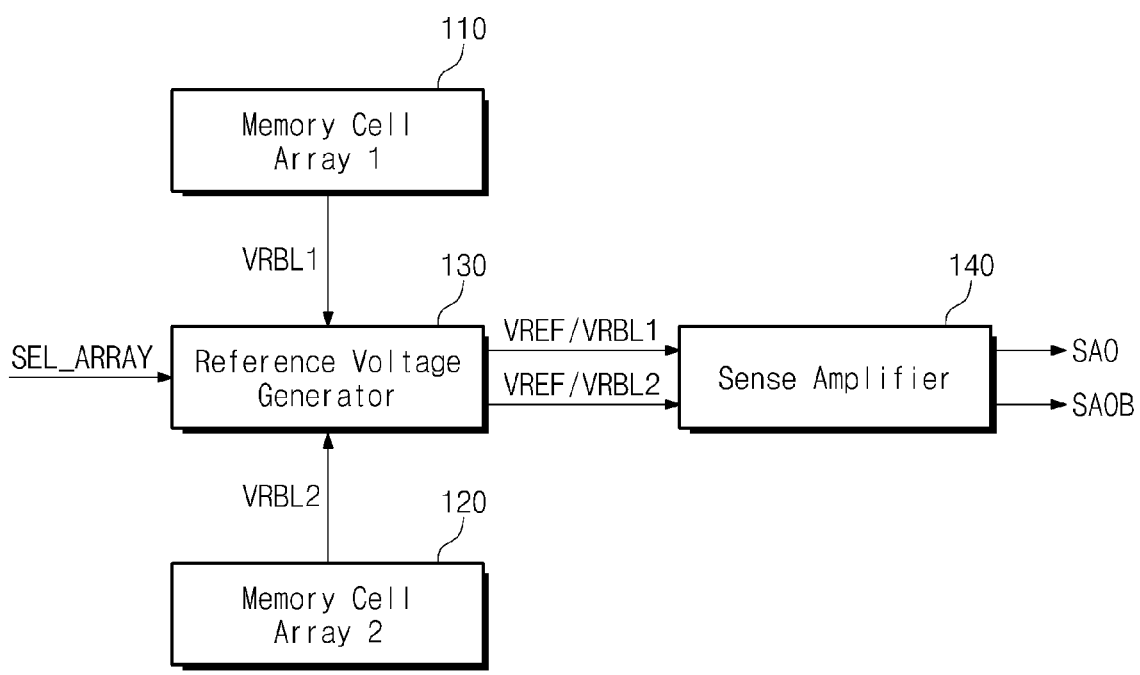
FIG. 3 is a block diagram of a memory device according to an example embodiment of the present inventive concepts.

FIG. 3 is a block diagram of a memory device 100 according to an example embodiment of the present inventive concepts. As illustrated, the memory device 100 includes memory cell arrays 110 and 120, a reference voltage generator 130, and a differential sense amplifier 140. The memory device 100 includes memory cells of a single-ended bitline structure. Each of the memory cell arrays 110 and 120 includes a plurality of memory cells of a single-ended bitline structure. The reference voltage generator 130 receives an array select signal SEL_ARRAY and bitline voltages VRBL1 and VRBL2 from the memory cell arrays 110 and 120, respectively, to output a sensing voltage VRBL1 or VRBL2 and a reference voltage VREF. The differential sense amplifier 140 amplifies a difference between the sensing voltage VRBL1 or VRBL2 and the reference voltage VREF to output sense amplifier output signals SAO and SAOB.

The memory cell arrays 110 and 120 may include 2-port SRAM memory cells 10 illustrated in connection with FIG. 1; however, the present inventive concepts are not limited thereto. That is, the memory cell arrays 110 and 120 may include other memory cells of a single-ended bitline structure. For example, the memory cell arrays 110 and 120 may include dynamic random access memory (DRAM) memory cells of a single-ended bitline structure. The memory cell arrays 110 and 120 output a voltage corresponding to data stored in a selected memory cell as bitline voltages VRBL1 and VRBL2, respectively, in response to an address signal.

The reference voltage generator 130 receives the array select signal SEL_ARRAY and the bitline voltages VRBL1 and VRBL2 from the memory cell arrays 110 and 120. The reference voltage generator 130 outputs a bitline voltage VRBL1 or VRBL2 of a selected memory cell array 110 or 120 as a sensing voltage according to the array select signal SEL_ARRAY. In addition, the reference voltage generator 130 outputs a bitline voltage VRBL1 or VRBL2 of an unselected memory cell array 110 or 120 as a reference voltage VREF. The reference voltage generator 130 adjusts and outputs a bitline voltage level so that the reference voltage VREF has a level complementary to a sensing voltage level. For example, the reference voltage generator 130 outputs a logic-low reference voltage when a sensing voltage level is logic 'high'. For example, the reference voltage generator 130 outputs a logic-high reference voltage when a sensing voltage level is logic 'low'.

The differential sense amplifier 140 receives the sensing voltage VRBL1 or VRBL2 and the reference voltage VREF and amplifies a difference between these voltages to output sense amplifier output signal SAO and SAOB.

The above-described memory device 100 generates a reference voltage VREF using an array select signal SEL_ARRAY and a bitline voltage VRBL1 or VRBL2 of a memory cell array 110 or 120. That is, the reference voltage generator 130 outputs a bitline voltage VRBL1 or VRBL2 of a selected memory cell 110 or 120 as a sensing voltage. The reference voltage generator 130 outputs a bitline voltage of an unselected memory cell array as a reference voltage VREF. For example, if the memory cell array 110 is the selected memory cell array and the memory cell array 120 is the unselected memory cell array, the reference voltage generator 130 outputs the bitline voltage VRBL1 of the memory cell array 110 as the sensing voltage and the bitline voltage VRBL2 of the memory cell array 120 as the reference voltage. Alternatively, if the memory cell array 120 is the selected memory cell array and the memory cell array 110 is the unselected memory cell array, the reference voltage generator 130 outputs the bitline voltage VRBL2 of the memory cell array 120 as the sensing voltage and the bitline voltage VRBL1 of the memory cell array 120 as the reference voltage. A logic state of the reference voltage VREF is complementary to that of the sensing voltage. Thus, the differential sense amplifier 140 may accurately amplify a difference between the reference voltage VREF and the sensing voltage depending on a state of stored data. Since the reference voltage generator 130 is disposed adjacent to the differential sense amplifier 140 and generates a reference voltage VREF using an internal signal, power consumption resulting from generation of the reference voltage may be reduced.

Figure 4:
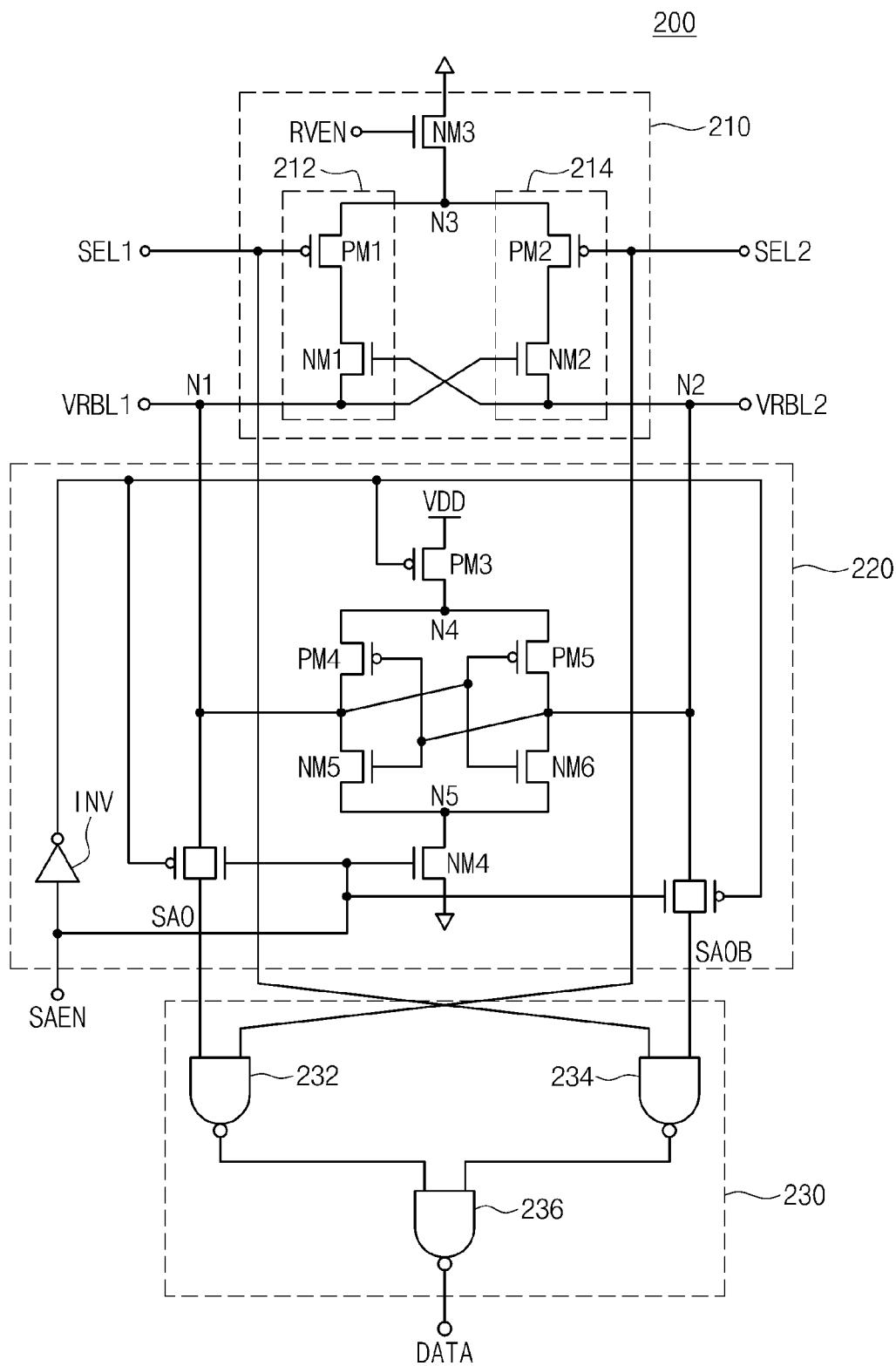
FIG. 4 is a circuit diagram of a memory device according to an example embodiment of the present inventive concepts.

FIG. 4 is a circuit diagram of a memory device 200 according to an example embodiment of the present inventive concepts. As illustrated, the memory device 200 includes a reference voltage generator 210, a differential sense amplifier 220, and a multiplexer 230. The reference voltage generator 210 outputs one of bitlines voltages VRBL1 and VRBL2 as a sensing voltage in response to array select signals SEL1 and SEL2 and outputs the other of bitline voltages VRBL1 and VRBL2 as a reference voltage VREF. The differential sense amplifier 220 amplifies a difference between the sensing voltage and the reference voltage VREF to output sense amplifier output signals SAO and SAOB. The multiplexer 230 receives and logically operates bitline voltages VRBL1 and VRBL2 and the array select signals SEL1 and SEL2 to output a data signal corresponding to a logic state of data stored in a selected memory cell. The memory device 200 according to the present inventive concepts will be described with reference to FIGS. 3 and 4. Although not shown in FIG. 4, the first bitline voltage VRBL1 of the reference voltage generator 210 is applied from a bitline of the first memory cell array 110 of FIG. 3, and the second bitline voltage VRBL2 of the reference voltage generator 210 is applied from a bitline of the second memory cell array 120 of FIG. 3. The array select signal SEL_ARRAY in FIG. 3 includes a first select signal SEL1 and a second select signal SEL2 that indicate information on a selected memory cell array. For example, when the first memory cell array 110 is enabled, the first select signal SEL may be a logic-high signal and the second select signal SEL2 may be a logic-low signal. In addition, when the second memory cell array 120 is enabled, the first select signal SEL may be a logic-low signal and the second select signal SEL2 may be a logic-high signal.

The reference signal generator 210 includes a first voltage output unit 212 and a second voltage output unit 214. The first voltage output unit 212 outputs the bitline voltage VRBL1 of the first memory cell array 110 as a sensing voltage or a reference voltage VREF according to the first select signal SEL1 and the bitline voltage VRBL2 of the second memory cell array 120. The second voltage output unit 214 outputs the bitline voltage VRBL2 of the second memory cell array 120 as a sensing voltage or a reference voltage VREF according to the second select signal SEL2 and the bitline voltage VRBL1 of the first memory cell array 110.

The first voltage output unit 212 includes a first pull-down transistor NM1 and a second pull-down transistor PM1 to output the bitline voltage VRBL1 of the first memory cell array 110 as a sensing voltage or a reference voltage VREF. The bitline voltage VRBL1 of the first memory cell array 110 is applied to one end of the first pull-down transistor NM1. The other end of the first pull-down transistor NM1 is connected to one end of the second pull-down transistor PM1 and is turned on or off in response to the bitline voltage VRBL2 of the second memory cell array 120. That is, the bitline VRBL2 is connected to the gate of the first pull-down transistor NM1. One end of the second pull-down transistor PM1 is connected to the other end of the first pull-down transistor NM1. The other end of the second pull-down transistor PM1 is connected to a node N3 and is turned on or off according to the first select signal SEL1. That is, the first select signal SEL1 is connected to the gate of the second pull-down transistor PM1. The first pull-down transistor NM1 and the second pull-down transistor PM1 are connected in series to form a voltage path from an input terminal of the first voltage output unit 212 to a ground voltage. The voltage path is opened or closed according to the first select signal SEL1 and the bitline voltage VRBL2 of the second memory cell array 120. When the voltage path is opened, a level of the bitline voltage VRBL1 of the first memory cell array 110 may decrease gradually. When the voltage path is closed, a level of the bitline voltage VRBL1 of the first memory cell array 110 may be maintained.

The second voltage output unit 214 includes a third pull-down transistor NM2 and a fourth pull-down transistor PM2 that receive the bitline voltage VRBL2 of the second memory cell array 120 to output as a sensing voltage or a reference voltage VREF. The bitline voltage VRBL2 of the second memory cell array 120 is applied to one end of the third pull-down transistor NM2. The other end of the third pull-down transistor NM2 is connected to one end of the fourth pull-down transistor PM2 and is turned on or off in response to the bitline voltage VRBL1 of the first memory cell array 110. That is, the bitline voltage VRBL1 is applied to the gate of the third pull-down transistor NM2. One end of the fourth pull-down transistor PM2 is connected to the other end of the third pull-down transistor NM2. The other end of the fourth pull-down transistor PM2 is connected to the node N3 and is turned on or off by the second select signal SEL2. That is, the second select signal SEL2 is applied to the gate of the fourth pull-down transistor PM2. The third pull-down transistor NM2 and the fourth pull-down transistor PM2 are connected in series to form a voltage path from an input terminal of the second voltage output unit 214 to a ground terminal. The voltage path is opened or closed according to the second select signal SEL2 and the bitline voltage VRBL1 of the first memory cell array 110. When the voltage path is opened, a level of the bitline voltage VRBL2 may decrease gradually. When the voltage path is closed, the level of the bitline voltage VRBL2 of the second memory cell array 120 may be maintained.

The detailed operation of the reference voltage generator 210 will be described with reference to FIGS. 5A and 5B.

The differential sense amplifier 220 amplifies and outputs a difference between a voltage of a node N1 and a voltage of a node N2. When the first memory cell array 110 is selected by the first select signal SEL1, the voltage of the node N1 may be the sensing voltage, and the voltage of the node N2 may be the reference voltage VREF. Alternatively, when the second memory cell array 120 is selected by the second select signal SEL2, the voltage of the node N2 may be the sensing voltage, and the voltage of the node N1 may be the reference voltage VREF. The operation of the differential sense amplifier 220 will be described below. It may be assumed that the voltage of the node N1 is a logic-high voltage and the voltage of the node N2 is a logic-low voltage.

The differential sense amplifier 220 is enabled by a sense amplifier enable signal SAEN after the bitline voltages VRBL1 and VRBL2 are adjusted. The sense amplifier enable signal SAEN turns on a transistor PM3 and a transistor NM4. The transistor PM3 drives a node N4 to a power supply voltage (VDD) level. The transistor NM4 drives a node N5 to a ground voltage level. The sense amplifier enable signal SAEN is inverted yb inverter INV prior to being applied to the transistor PM3.

A transistor NM6 is turned on in response to a logic-high voltage of the node N1. A transistor PM4 is turned on in response to a logic-low voltage of the node N2. Accordingly, the voltage of the node N1 rises up to a power supply voltage (VDD) level and the voltage of the node N2 may drop down to a the ground voltage level. Thus, if the node N1 is a logic-high voltage and the voltage of the node N2 is a logic-low voltage, the differential sense amplifier 220 outputs an output signal SAO of the power supply voltage level (VDD) level and an output signal SAOB of the ground voltage level. That is, the differential sense amplifier 220 outputs a voltage difference between two input signals lower than the power supply voltage (VDD) level after amplifying the voltage difference to the power supply voltage (VDD) level. If the voltage of the node N1 is a logic-low voltage and the voltage of the node N2 is a logic-high voltage, a transistor NM5 and a transistor PM5 may be turned on. In this embodiment, the output signal SAO of the differential sense amplifier 220 may be the ground voltage level and the output signal SAOB thereof may be the power supply voltage (VDD) level.

The multiplexer 230 includes logic gates, for example, first, second and third NAND gates 232, 234, and 236, respectively. The multiplexer 230 outputs a data signal DATA corresponding to a logic state of data stored in a selected memory cell in response to the output signals SAO and SAOB of the differential sense amplifier 220 and the first and second select signals SEL and SEL2. The first NAND gate 232 is configured to receive and logically operate the first output signal SAO of the differential sense amplifier 220 and the second select signal SEL2 to output a logic output signal. The second NAND gate 234 is configured to receive and logically operate a second output signal SAOB of the differential sense amplifier 220 and the first select signal SEL1 to output a logic output signal. The third NAND gate 236 is configured to receive and logically operate the logic output signals of the first and second NAND gates 232 and 234, respectively, to output a data signal DATA. Hereinafter, a description will be made with respect to the operation of the multiplexer 230 when the first memory cell array 110 is selected and data stored in the data node QB is logic 'high'.

Referring to FIG. 2, when the data stored in the data node QB is logic 'high', a bitline voltage VRBL1 of the first memory cell array 110 is a logic-low voltage, the first select signal SEL1 is a logic-high voltage and the second select signal SEL2 is a logic-low voltage. The reference voltage generator 210 outputs a logic-low reference voltage VREF in response to a logic-low bitline voltage VRBL1 of the first memory cell array 110.

Thus, the logic gate 232 receives and logically operates the logic-low second select signal SEL2 and the logic-low output SAO to output a logic-high output signal. The logic gate 234 receives the logic-high first select signal SEL1 and the logic-high output SAOB to output a logic-low output signal. The logic gate 236 receives the output signals of the logic gates 232 and the logic gate 234 to output a logic-high data signal DATA. As described above, the data signal DATA is the same as logic state of the data stored in the data node QB. The logic gate may be a NAND logic gate.

Figure 5A:
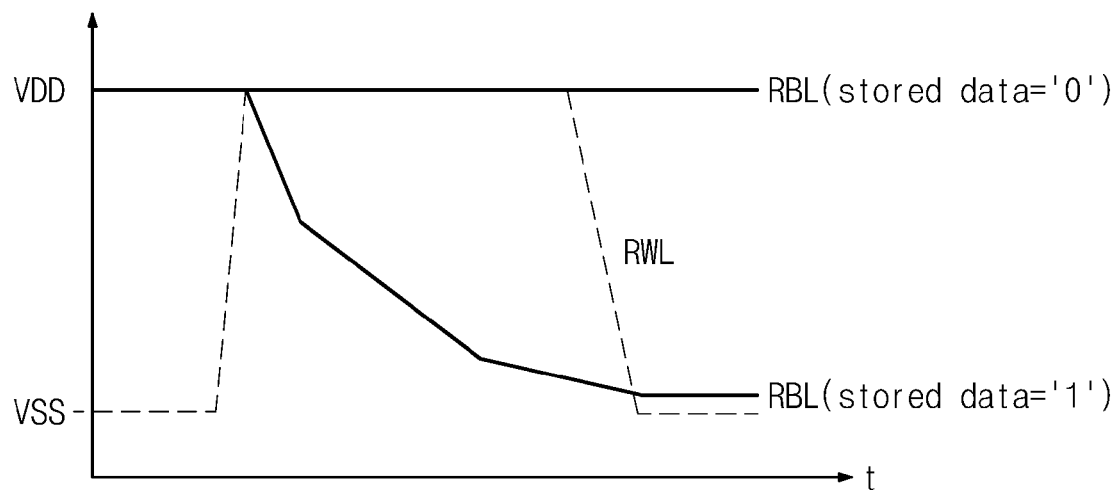
FIG. 5A is a graph illustrating the operation of a reference voltage generator of FIG. 4 and FIGS. 5B, 5C, 5D and 5E are circuit diagrams illustrating the operation of a reference voltage generator of FIG. 4.
Figure 5B:
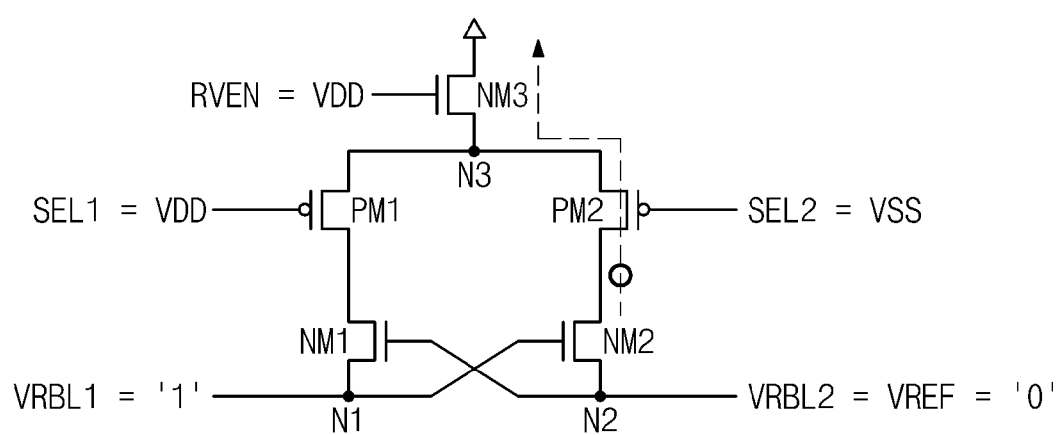
Figure 5C:
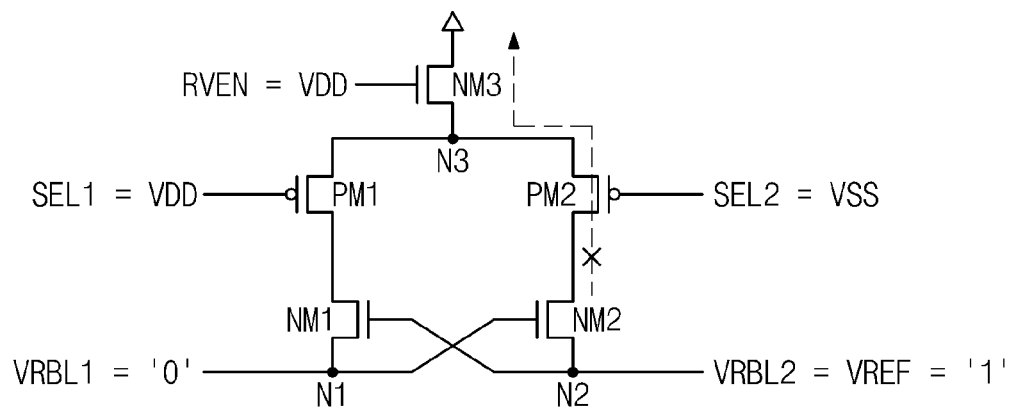

FIGS. 5A, 5B, 5C, 5D and 5E illustrate the operation of the reference voltage generator 210 according to FIG. 4. FIG. 5A is a graph illustrating a bitline voltage according to a logic state of data stored in a data node QB. FIG. 5B is a circuit diagram illustrating the operation of the reference voltage generator 210 when the data stored in the data node QB is logic 'low' and the memory cell array 110 is selected, and FIG. 5C is a circuit diagram illustrating the operation of the reference voltage generator 210 when the data stored in the data node QB is logic 'high' and the memory cell array 110 is selected. Prior to a read operation, bitline voltages VRBL1 and VRBL2 of the memory cell arrays 110 and 120 are precharged to a precharge voltage level. In this embodiment, the precharge voltage level may be a power supply voltage (VDD) level. FIGS. 5B and 5C each illustrate an example when the first memory cell array 110 is selected.

The operation of the reference voltage generator 210 according to FIG. 5B will be described below with reference to FIGS. 1, 3, and 4.

When the data stored in the data node QB is logic 'low', the bitline voltage VRBL1 of the first memory cell array 110 is a logic-high voltage ('1'). Since the first memory cell array 110 is selected, the first select signal SEL1 is a logic-high voltage which is a power supply voltage VDD and the second select signal SEL2 is a logic-low voltage which is a ground voltage VSS level. A bitline voltage VRBL2 of an unselected second memory cell array 120 may be a precharge voltage which is a power supply voltage VDD.

The transistor NM3 is turned on in response to a reference voltage generator enable signal RVEN. The reference voltage generator enable signal RVEN may be generated by a memory controller (not shown). The transistor PM1 is turned off in response to the first select signal SEL1 which is a power supply voltage VDD. The transistor PM2 is turned on in response to the second select signal SEL2 which is a ground voltage VSS. The bitline voltage VRBL1 of the first memory cell array 110 is maintained at a logic-high voltage by the turned-off transistor PM1. The transistor NM2 is turned on in response to a bitline voltage VRBL1 of the first memory cell array 110 that is a logic-high voltage. The transistors NM3, PM2, and NM2 are turned on to form a voltage path from the node N2 to a ground terminal. Thus, the bitline voltage VRBL2 of the precharged second memory cell array 120 decreases to be a logic-low voltage. The decreased logic-low bitline voltage VRBL2 is output as a reference voltage VREF as illustrated in FIG. 5B.

The operation of the reference voltage generator 210 according to FIG. 5C will be described with reference to FIGS. 1, 3, and 4.

When the data stored in the data node QB is logic 'high', the bitline voltage VRBL1 of the first memory cell array 110 is a logic-low voltage ('0'). Since the first memory cell array 110 is selected, the first select signal SEL1 is a logic-high voltage which is a power supply voltage VDD and the second select signal SEL2 is a logic-low voltage which is a ground voltage VSS. A bitline voltage VRBL2 of an unselected second memory cell array 120 is a precharge voltage which is a power supply voltage VDD.

The transistor NM3 is turned on in response to the reference voltage generator enable signal RVEN. The transistor PM1 is turned off in response to the first select signal SEL1 which is a power supply voltage VDD. The transistor PM2 is turned on in response to the second select signal SEL2 which is a ground voltage VSS. The bitline voltage VRBL1 of the first memory cell array 110 is maintained at a logic-low voltage by the turned-off transistor PM1. The transistor NM2 is turned off in response to the logic-low bitline voltage VRBL1 of the first memory cell array 110. Due to the turned-off operation of the transistor NM2, a voltage path from the node N2 to a ground terminal is not formed. Thus, the precharged bitline voltage VRBL2 of the second memory cell array 120 is maintained. The logic-high bitline voltage VRBL2 is output as a reference voltage VREF, as illustrated in FIG. 5C.

Figure 5D:
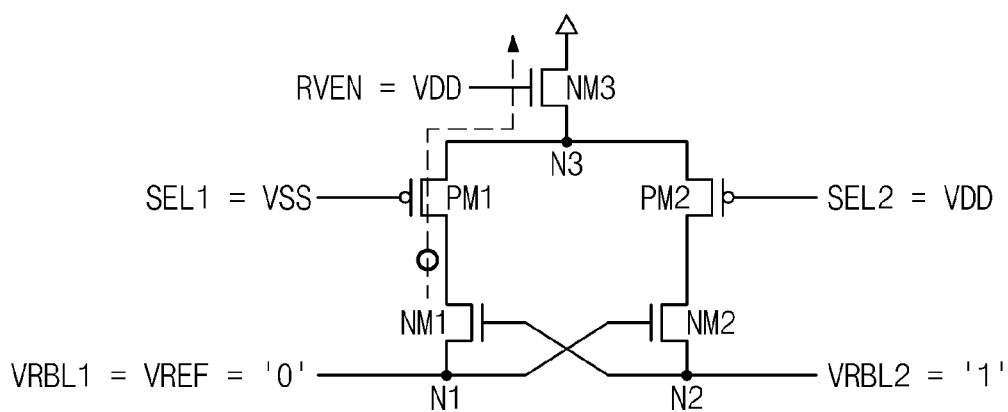
Figure 5E:
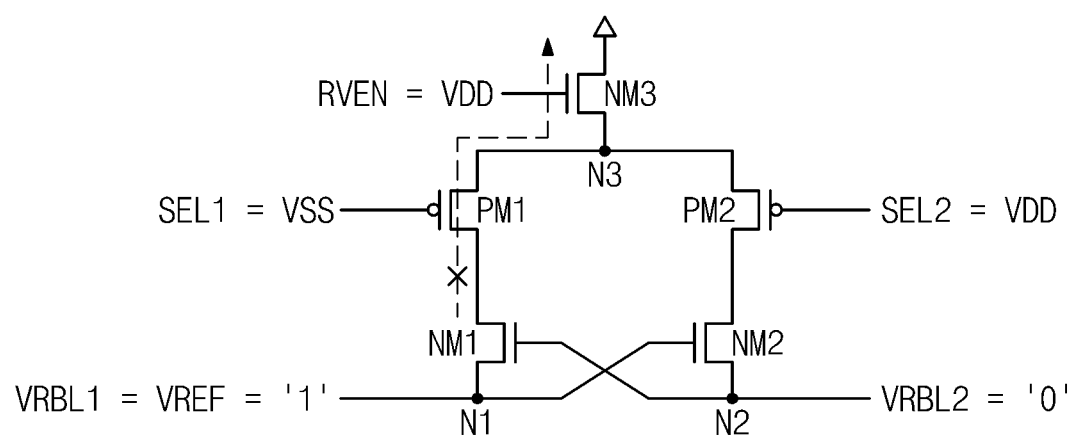

FIG. 5D is a circuit diagram illustrating the operation of the reference voltage generator 210 when the data stored in the data node QB is logic 'low' and the memory cell array 1200 is selected, and FIG. 5E is a circuit diagram illustrating the operation of the reference voltage generator 210 when the data stored in the data node QB is logic 'high' and the memory cell array 120 is selected.

The operation of the reference voltage generator 210 according to FIG. 5D will be described below with reference to FIGS. 1, 3, and 4.

When the data stored in the data node QB is logic 'low', the bitline voltage VRBL2 of the second memory cell array 120 is a logic-high voltage ('1'). Since the second memory cell array 120 is selected, the second select signal SEL2 is a logic-high voltage which is a power supply voltage VDD and the second select signal SEL1 is a logic-low voltage which is a ground voltage VSS level. A bitline voltage VRBL1 of an unselected second memory cell array 110 may be a precharge voltage which is a power supply voltage VDD.

The transistor NM3 is turned on in response to a reference voltage generator enable signal RVEN. The transistor PM2 is turned off in response to the second select signal SEL2 which is a power supply voltage VDD. The transistor PM1 is turned on in response to the second select signal SEL1 which is a ground voltage VSS. The bitline voltage VRBL2 of the second memory cell array 120 is maintained at a logic-high voltage by the turned-off transistor PM2. The transistor NM1 is turned on in response to a bitline voltage VRBL2 of the second memory cell array 120 that is a logic-high voltage. The transistors NM3, PM1, and NM1 are turned on to form a voltage path from the node 1 to a ground terminal. Thus, the bitline voltage VRBL1 of the precharged first memory cell array 110 decreases to be a logic-low voltage. The decreased logic-low bitline voltage VRBL1 is output as a reference voltage VREF as illustrated in FIG. 5D.

The operation of the reference voltage generator 210 according to FIG. 5E will be described with reference to FIGS. 1, 3, and 4.

When the data stored in the data node QB is logic 'high', the bitline voltage VRBL2 of the second memory cell array 120 is a logic-low voltage ('0'). Since the second memory cell array 120 is selected, the second select signal SEL2 is a logic-high voltage which is a power supply voltage VDD and the first select signal SEL1 is a logic-low voltage which is a ground voltage VSS. A bitline voltage VRBL1 of an unselected first memory cell array 110 is a precharge voltage which is a power supply voltage VDD.

The transistor NM3 is turned on in response to the reference voltage generator enable signal RVEN. The transistor PM2 is turned off in response to the second select signal SEL2 which is a power supply voltage VDD. The transistor PM1 is turned on in response to the first select signal SEL1 which is a ground voltage VSS. The bitline voltage VRBL2 of the second memory cell array 120 is maintained at a logic-low voltage by the turned-off transistor PM2. The transistor NM1 is turned off in response to the logic-low bitline voltage VRBL2 of the second memory cell array 120. Due to the turned-off operation of the transistor NM1, a voltage path from the node N1 to a ground terminal is not formed. Thus, the precharged bitline voltage VRBL1 of the first memory cell array 110 is maintained. The logic-high bitline voltage VRBL1 is output as a reference voltage VREF, as illustrated in FIG. 5E.

As described above, the reference voltage generator 210 outputs a bitline voltage of a selected memory cell array as a sensing voltage. The reference voltage generator 210 outputs a bitline voltage of an unselected memory cell array as a reference voltage VREF after adjusting the bitline voltage of the unselected memory cell array according to the bitline voltage of the selected memory cell array. A logic state of the reference voltage VREF is complementary to that of the sensing voltage.

Figure 6:
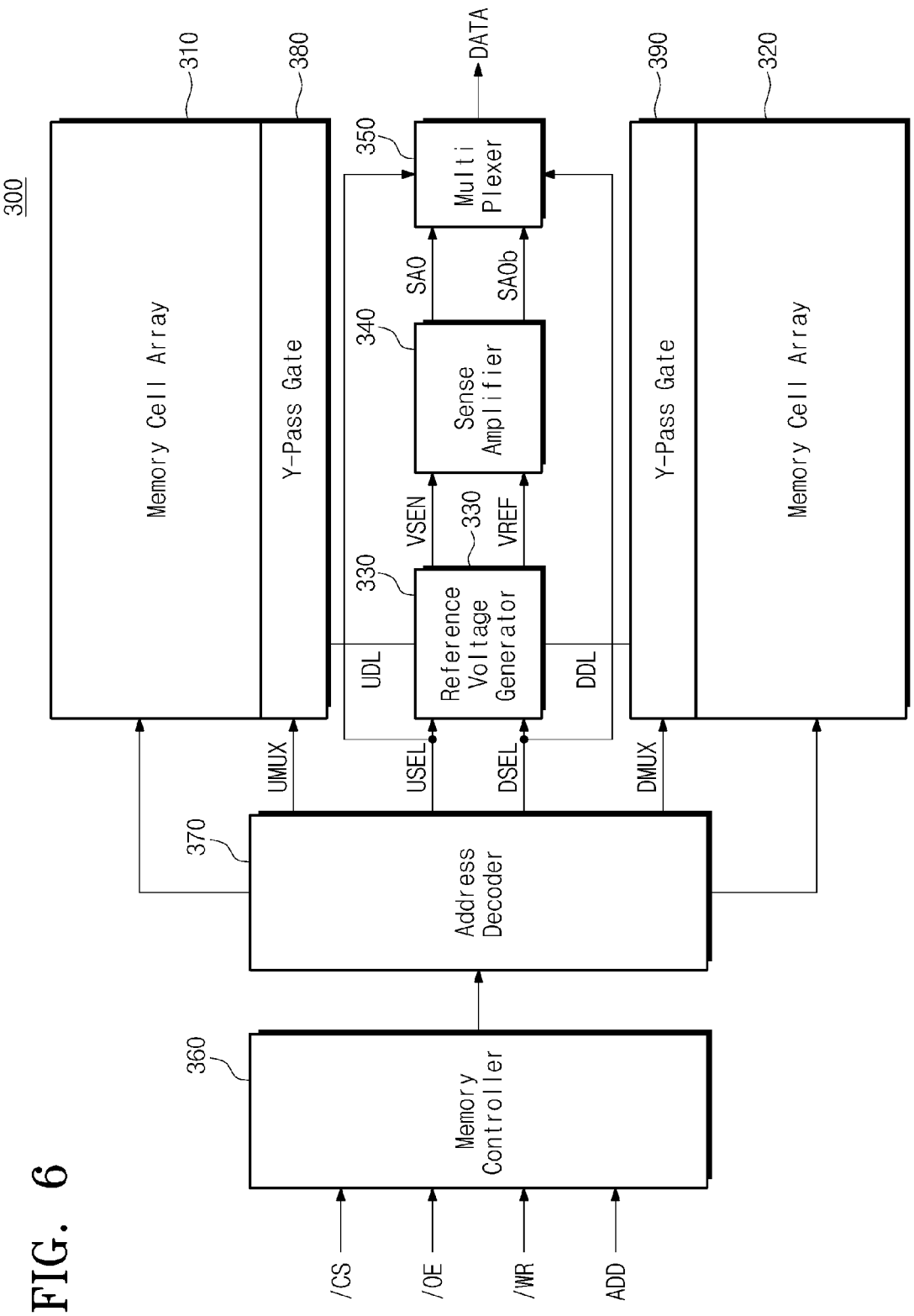
FIG. 6 is a block diagram of a memory device according to an example embodiment of the present inventive concepts.

FIG. 6 is a block diagram of a memory device 300 according to an example embodiment of the present inventive concepts. As illustrated, the memory device 300 includes memory cell arrays 310 and 320, a reference voltage generator 330, a differential sense amplifier 340, a multiplexer 350, a memory controller 360, an address decoder 370, and Y-pass gates 380 and 390. The memory device 300 may be a memory device having an open bitline structure. The open bitline structure means a structure in which the sense amplifier 340 is disposed in a center and memory cell arrays 310 and 320 are disposed above and below the sense amplifier 340, respectively. The memory cell arrays 310 and 320 disposed above and below the sense amplifier 340, respectively, of open bitline structured memory may share a single sense amplifier.

The memory cell arrays 310 and 320 include memory cells of a single-ended bitline structure. For example, a memory cell of a single-ended bitline structure may be a 2-port SRAM memory cell 10 illustrated in FIG. 1. In the memory device of the open bitline structure, the memory cell array 310 may be called an upper memory cell array and the memory cell array 320 may be called a lower memory cell array.

The reference voltage generator 330 receives select signals USEL and DSEL from the address decoder 370 and voltages of data lines UDL and DDL from the memory cell arrays 310 and 320, respectively, to output a sensing voltage VSEN and a reference voltage VREF. The select signal USEL and DSEL may be generated at the address decoder 370. The select signals USEL and DSEL indicate information on an enabled memory cell array. For example, when the memory cell array 310 is enabled, the select signal USEL may be logic 'high' and the select signal DSEL may be logic 'low'. When the memory cell array 310 is enabled, the reference voltage generator 330 outputs a data line (UDL) voltage of the enabled memory cell array 310 as a sensing voltage VSEN, and the reference voltage generator 330 outputs a data line (DDL) voltage of the disabled memory cell array 320 as a reference voltage VREF. The output reference voltage VREF is complementary to the sensing voltage VSEN. That is, when the sensing voltage VSEN is logic 'high', the reference voltage VREF is logic 'low' and, when the sensing voltage VSEN is logic 'low', the reference voltage VREF is logic 'high'

The differential sense amplifier 340 receives the sensing voltage VSEN and the reference voltage VREF to amplify and output a difference between the two voltages VSEN and VREF. Output signals SAO and SAOB of the differential sense amplifier 340 may be differential signals, and a difference between the two voltages VSEN and VREF may be a power supply voltage VDD level.

The multiplexer 350 receives the select signals USEL and DSEL from the address decoder 370 and the output signals SAO and SAOB of the differential sense amplifier 340 to output a data signal DATA. The data signal DATA is a signal corresponding to a logic state of data stored in a selected memory cell. For example, when a logic state of the data stored in the selected memory cell is logic 'high', a logic state of the data signal DATA may be logic 'high'.

The memory controller 360 controls the overall operations of the memory device 300 in response to control signals /CS, /OE, and /WR and address signal ADD of external devices, for example, a host, a memory controller, and a memory interface. For example, the controller 360 may control a read operation and a write operation of the memory device 300.

The address decoder 370 generates signals to select a memory cell in response to the address signal ADD. The address decoder 370 may generate signals UMUX and DMUX and provide the signals to the Y pass gates 380 and 390, respectively, to select a specific bitline through the Y-pass gates 380 and 390. Alternatively, the address decoder 370 may generate select signals USEL and DSEL indicating information on an enabled memory cell array.

As described above, in an embodiment in which a memory device of an open bitline structure, the reference voltage generator 330 may be disposed in a region adjacent to a differential sense amplifier. The reference voltage generator 330 as illustrated in FIG. 6 is advantageous in that the reference voltage generator 330 may easily receive a bitline voltage from an upper memory cell array 310 and a lower memory cell array 320.

Figure 7:
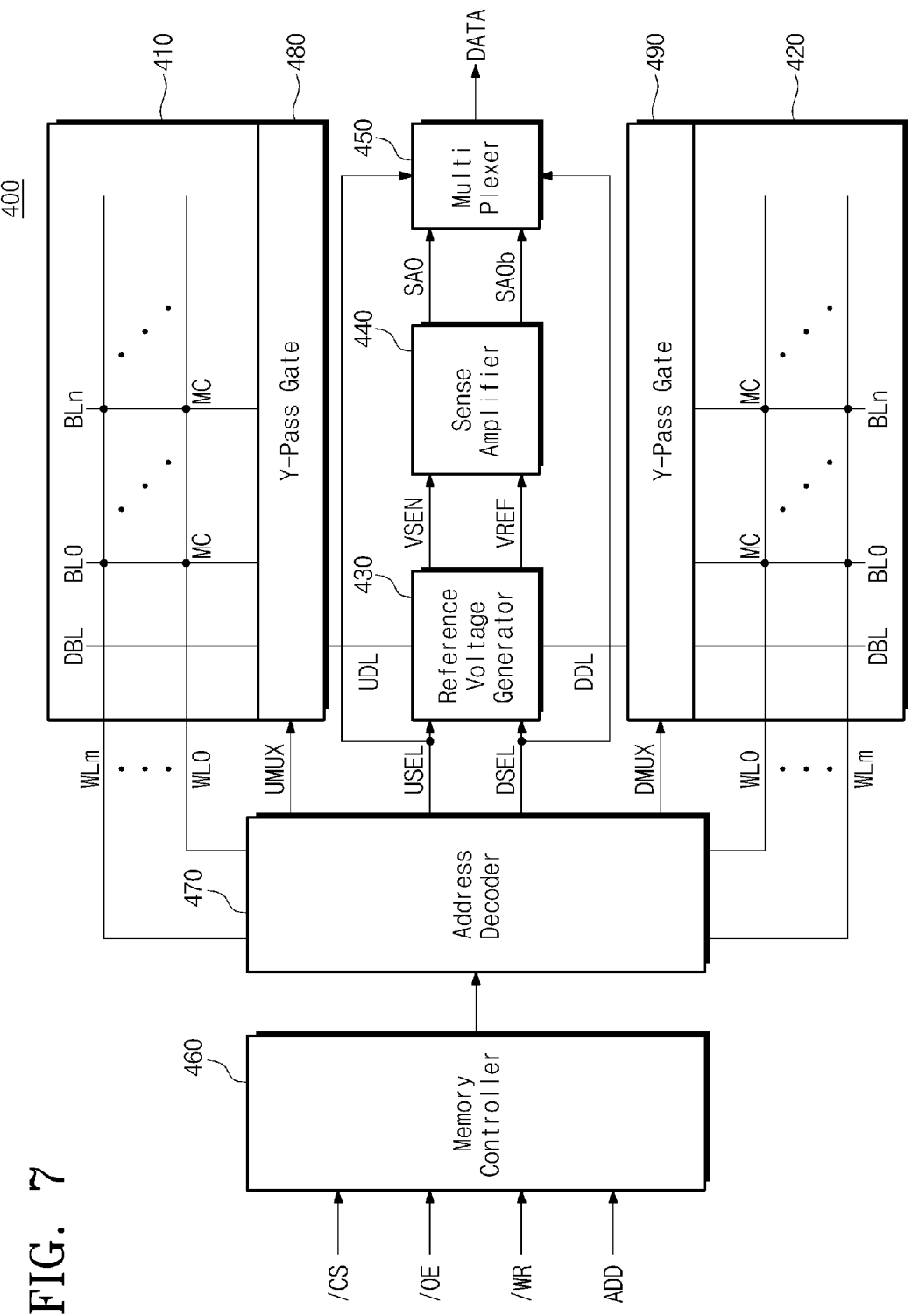
FIG. 7 is a block diagram of a memory device according to an example embodiment of the present inventive concepts.

FIG. 7 is a block diagram of a memory device 400 according to an example embodiment of the present inventive concepts. As illustrated in FIG. 7, the memory device 400 includes memory cell arrays 410 and 420, a reference voltage generator 430, a differential sense amplifier 440, a multiplexer 450, a memory controller 460, an address decoder 470, and Y-pass gates 480 and 490. The memory device 400 generates a reference voltage VREF using a dummy bitline DBL. That is, each of the memory cell arrays 410 and 420 may include at least one dummy bitline DBL.

The memory cell arrays 410 and 420 include a plurality of memory cells MC that are disposed at intersections of wordlines WL0 through WLm and bitlines BL0 through BLn. The memory cell arrays 410 and 420 include a dummy bitline DBL. The dummy bitline DBL is precharged to a precharge voltage during a read operation of the memory device 400.

The operation of the memory device 400 shown in FIG. 7 will now be described by illustrating differences between the operation of the memory device 400 and the operation of the memory device 300 illustrated in FIG. 6. The operation description will be made under the assumption that the memory cell array 410 is enabled.

One of the memory cells MC of the memory cell array 410 is selected by the address decoder 470. A bitline voltage connected to the selected memory cell varies or is maintained at a precharge voltage level depending on a state of stored data. The bitline voltage connected to the selected memory cell is connected to a data line UDL by the Y-pass gate 480. The dummy bitline DBL of an unselected memory cell array 420 and a data line DDL are connected to each other by the Y-pass gate 490. In this embodiment, the dummy bitline DBL of the unselected memory cell array 420 is in a state precharged to the precharge voltage.

The reference voltage generator 430 receives voltages of data lines UDL and DDL from the memory cell arrays 410 and 420, respectively, and select signals USEL and DSEL from the address decoder 470 to generate a sensing voltage VSEN and a reference voltage VREF. When the memory cell array 410 is enabled, the sensing voltage is the voltage of the data line UDL. The reference voltage VREF may be the voltage of the data line DDL or a ground-level voltage according to the voltage of the data line UDL.

The differential sense amplifier 440 receives the sensing voltage VSEN and the reference voltage VREF from the reference voltage generator 430 to amplify and output a difference between the two voltages VSEN and VREF.

The multiplexer 450 receives output signals SAO and SAOB of the differential sense amplifier 440 and select signals USEL and DSEL from the address decoder 470 to output a data signal DATA corresponding to a logic state of data stored in a selected memory cell.

As described above, a memory device according to the present inventive concepts is a memory device including a 2-port SRAM memory cell. However, the memory devices according to the present inventive concepts are not limited to an SRAM. A reference voltage generator according to the present inventive concepts may be applied to a memory device including memory cells of a single-ended bitline structure. Therefore, the memory device according to the present inventive concepts may be a DRAM. In addition, the reference voltage generator according to the present inventive concepts may be easily applied to a memory device of an open bitline structure.

Figure 8:
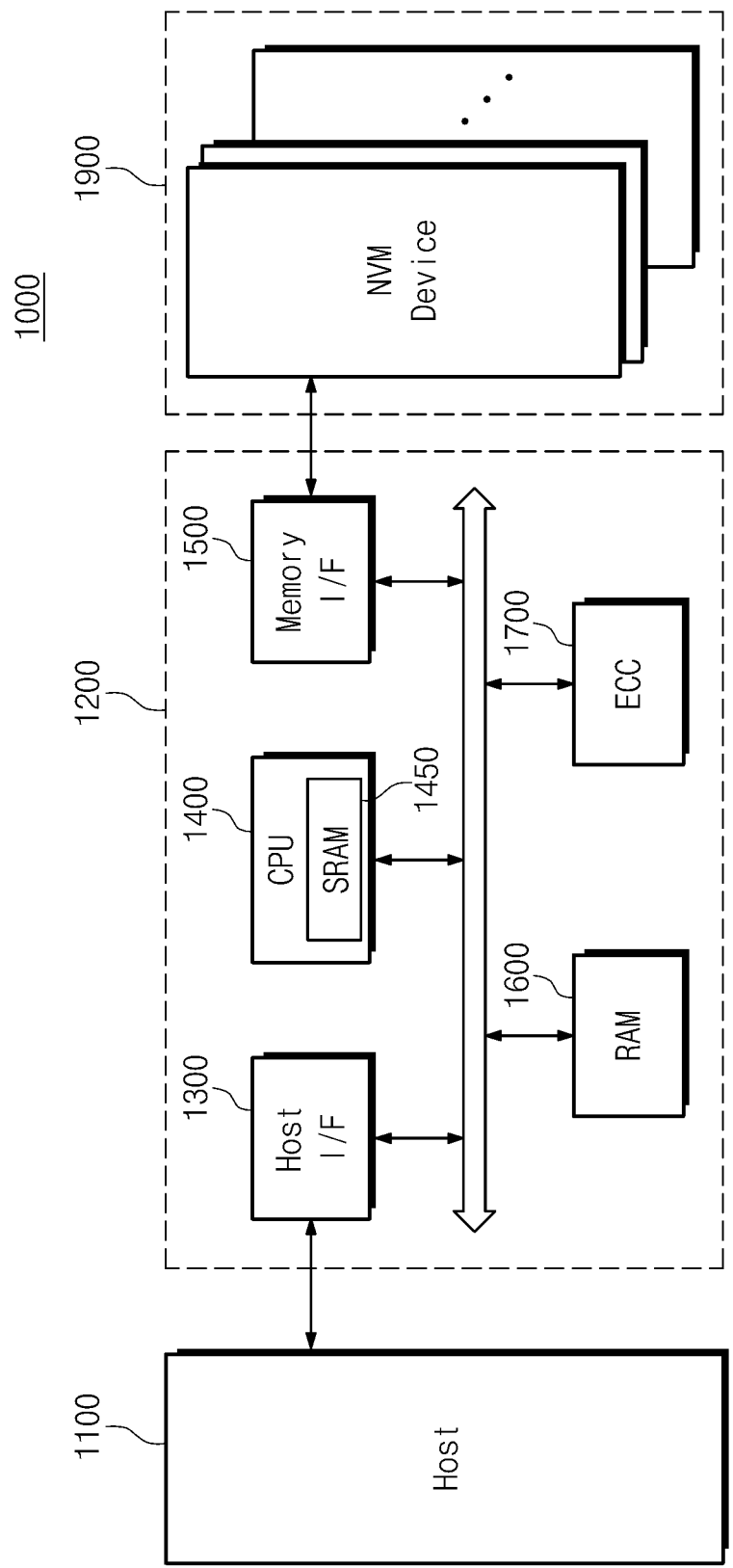
FIG. 8 is a block diagram of a user device including a memory device according to the embodiments of the present inventive concepts.

FIG. 8 is a block diagram of a user device 1000 including a memory device according to an example embodiment of the present inventive concepts. As illustrated, the user device 1000 includes a memory controller 1200 and a nonvolatile memory device 1900.

The memory controller 1200 is connected to a host 1100 and the nonvolatile memory devices 1900. The memory controller 1200 is configured to access the nonvolatile memory devices 1900 in response to a request from the host 1100. For example, the memory controller 1200 is configured to control read, write, and erase operations of the nonvolatile memory devices 1900. The memory controller 1200 is configured to provide an interface between the nonvolatile memory devices 1900 and the host 1100. The memory controller 1200 is configured to drive firmware for controlling the nonvolatile memory devices 1900.

The memory controller 1200 may include well-known components such as a central processing unit (CPU) 1400, a host interface 1300, an error correcting code (ECC) block 1700, a RAM 1600, and a memory interface 1500 connected by a system bus. A central processing unit (CPU) 1400 may include an SRAM device 1450 according to an example embodiment of the present inventive concepts.

The RAM 1600 may be used as a working memory of the CPU 1400. The RAM 1600 may be a memory device according to an example embodiment of the present inventive concepts. In this embodiment, the RAM 1600 may be a DRAM. The SRAM device 1450 may be used as a cache memory of the CPU 1400. The CPU 1400 controls the overall operation of the memory controller 1200.

The host interface 1300 may include a protocol to exchange data between the host 1100 and the memory controller 1200. For example, the memory controller 1200 may be configured to communicate with an external device, for example, host, via one of various interface protocols such as USB (Universal Serial Bus), MMC (multimedia card), PCI (peripheral component interconnection), PCI-E (PCI-express), ATA (Advanced Technology Attachment), SATA (Serial-ATA), SCSI (small computer small interface), ESDI (enhanced small disk interface), IDE (Integrated Drive Electronics), or the like.

The error correction code (ECC) block 1700 may be configured to detect and correct an error of data read from the nonvolatile memory devices 1900. The ECC block 1700 may be provided as a component of the memory controller 1200. In some embodiments, the ECC block 1700 may be provided as a component of each of the nonvolatile memory devices 1900. The memory interface 1500 may interface the nonvolatile memory devices 1900 with the memory controller 1200.

It will be understood that components of the memory controller 1200 are not limited to the above-mentioned components. For example, the memory controller 1200 may further include, for example, a read only memory (ROM) storing code data required for an initial startup operation and data for interfacing with the host 1100.

The memory controller 1200 and the nonvolatile memory devices 1900 may be integrated into a single semiconductor device to constitute a memory card. For example, the controller 1200 and the nonvolatile memory devices 1900 may be integrated into a single semiconductor device to constitute a memory card such as a personal computer memory card international association (PCMCA) card, a compact flash card (CF), a smart media card (SM, SMC), a memory stick, a multimedia card (MMC, RS-MMC, MMC-micro), an SD card (SD, miniSD, microSD, SDHC), a universal flash storage (UFS), or the like.

In some embodiments, the memory controller 1200 and the nonvolatile memory devices 1900 may be applied to a solid state drive (SSD), a computer, a portable computer, an ultra-mobile PC (UMPC), a workstation, a net-book, a personal digital assistant (PDA), a portable computer, a web tablet, a wireless phone, a mobile phone, a digital camera, a digital audio recorder, a digital audio player, a digital video recorder, a digital video player, a device capable of transmitting/receiving information in a wireless environment, one of various electronic devices constituting a home network, one of various electronic devices constituting a computer network, one of various electronic devices constituting a telematics network, one of various electronic devices constituting a computing system, a radio frequency identification (RFID) device, an embedded system, or the like.

The CPU 1400 of the user interface 1000 may include an SRAM device 1450 according to an example embodiment of the present inventive concepts. The SRAM device 1450 may include a memory cell array including 2-port SRAM memory cells. The SRAM 1450 may include the above-described reference voltage generator to perform a read operation. The reference voltage generator may be disposed inside a memory to generate a reference voltage of a sense amplifier by using a bitline voltage and an array select signal as described in the example embodiments of the present inventive concepts. Since the SRAM 1450 does not include a separate reference voltage generator, power consumption may be reduced during a read operation.

Figure 9:
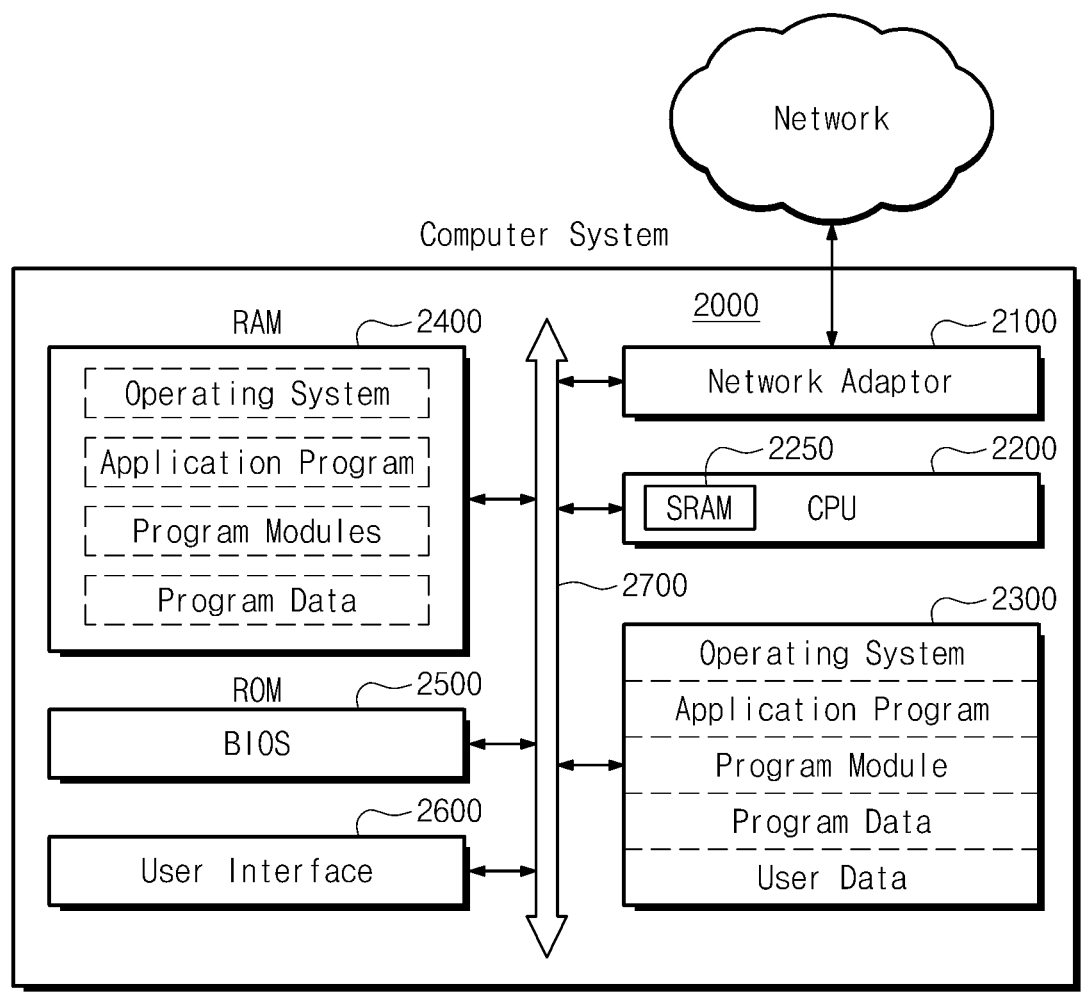
FIG. 9 is a block diagram of a computer system including a memory device according to the embodiments of the present inventive concepts.

FIG. 9 is a block diagram of a computer system 2000 including a memory device according to the example embodiments of the present inventive concepts. As illustrated, the computer system 2000 includes a network adaptor 2100, a central processing unit (CPU) 2200, a data storage device 2300, a RAM 2400, a ROM 2500, and a user interface 2600 which are electrically connected to a system bus 2700. The CPU 2200 includes an SRAM device 2250 according to an example embodiment of the present inventive concepts.

The network adaptor 2100 provides interfacing between the computer system 2000 and external networks. The CPU 2200 performs overall operation processing to drive an operating system (OS) or an application program that is resident in the RAM 2400. The CPU 2200 may use the SRAM device 2250 as a cache memory to perform the operation processing. The SRAM 2250 may include 2-port SRAM memory cells so that a reference voltage may be generated by the reference voltage generator of the example embodiments of the present inventive concepts during a read operation. A sense amplifier amplifies a difference between two voltages using the generated reference voltage and sensing voltage to perform a sensing operation. Since the SRAM 2250 does not include a separate reference voltage generator, power consumption may be reduced during a read operation.

The data storage device 2300 stores overall data required in the computer system 2000. For example, the data storage device 2300 stores an operating system (OS) to drive the computer system 2000, an application program, various program modules, program data, and user data.

The RAM 2400 may be used as a working memory of the computer system 2000. The RAM 2400 may be a memory device according to an example embodiment of the present inventive concepts. In this embodiment, the RAM 2400 may be a DRAM. The operating system (OS), the application program, the various program modules, and the program data used to drive programs, which are read from the data storage device 2300, are loaded into the RAM 2400 during a startup operation. A basic input/output system (BIOS), which is activated before the OS is driven, is stored in the ROM 2500 during the startup operation. Information exchanges between the computer system 2000 and a user through the user interface 2600.

The computer system 2000 may further include, for example, a battery, a modem, and/or the like. Although not shown in FIG. 9, it will be understood that the computer system 2000 may further include, for example, an application chipset, a camera image processor (CIS), a mobile DRAM, and/or the like.

As described above, a reference voltage is generated using an internal signal and an internal circuit of a memory device to reduce power consumption and a chip area as compared with a memory device which includes a separate external reference signal generator.

While the present inventive concepts have been particularly shown and described with reference to example embodiments thereof, the general inventive concepts are not limited to the above-described embodiments. It will be understood by those of ordinary skill in the art that various changes and variations in form and details may be made therein without departing from the spirit and scope of the inventive concepts as defined by the following claims.

What is claimed is:

1. A memory device comprising:
  a first memory cell array comprising memory cells of a single-ended bitline structure;
  a second memory cell array comprising memory cells of a single-ended bitline structure;
  a reference voltage generator configured to receive a bitline voltage from the first memory cell array and a bitline voltage from the second memory cell array, configured to select one of the first memory cell array and the second memory cell array and configured to output the bitline voltage of the selected one of the first and second memory cell arrays as a sensing voltage according to an array select signal and to output the bitline voltage of an unselected memory cell array as a reference voltage; and
  a differential sense amplifier configured to receive the sensing voltage and the reference voltage and configured to amplify and output a difference between the sensing voltage and the reference voltage,
  wherein logic states of the sensing voltage and the reference voltage are complementary to each other.

2. The memory device of claim 1, wherein the reference voltage generator adjusts a level of the bitline voltage of the unselected memory cell according to a level of the bitline voltage of the selected memory cell array and outputs the adjusted bitline voltage as the reference voltage.

3. The memory device of claim 2, wherein the array select signal includes a first select signal indicating whether the first memory cell array is selected and a second select signal indicating whether the second memory cell array is selected, and wherein logic states of the first and second select signals are complementary to each other.

4. The memory device of claim 3, wherein the reference voltage generator comprises:
  a first voltage output unit configured to receive the bitline voltage of the first memory cell and the first select signal and configured to output the bitline voltage of the first memory cell array as the sensing voltage or the reference voltage according to the first select signal and the bitline voltage of the second memory cell array; and
  a second voltage output unit configured to receive the bitline voltage of the second memory cell and the second select signal and configured to output the bitline voltage of the second memory cell array as the sensing voltage or the reference voltage according to the second select signal and the bitline voltage of the first memory cell array.

5. The memory device of claim 4, wherein the first voltage output unit outputs the bitline voltage of the first memory cell array as the sensing voltage and the second voltage output unit outputs the bitline voltage of the second memory cell array as the reference voltage when the first select signal is logic high.

6. The memory device of claim 5, wherein the first voltage output unit outputs the bitline voltage of the first memory cell array as the reference voltage and the second voltage output unit outputs the bitline voltage of the second memory cell array as the sensing voltage when the second select signal is logic high.

7. The memory device of claim 4, wherein the first voltage output unit includes a first pull-down transistor and a second pull-down transistor that are connected in series and configured to drive the bitline voltage of the first memory cell array to a ground voltage level in response to the first select signal and the bitline voltage of the second memory cell array.

8. The memory device of claim 7, wherein the second voltage output unit includes a third pull-down transistor and a fourth pull-down transistor that are connected in series and configured to drive the bitline voltage of the second memory cell array to a ground voltage level in response to the second select signal and the bitline voltage of the first memory cell array.

9. The memory device of claim 8, further comprising:
  a multiplexer configured to output a data signal corresponding to a logic state of data stored in the selected memory cell in response to an output signal of the differential sense amplifier and the first and second select signals.

10. A memory device of an open bitline structure, comprising:
  an upper memory cell array comprising memory cells of a single-ended bitline structure;
  a lower memory cell array comprising memory cells of a single-ended bitline structure;
  an address decoder configured to output an array select signal selecting one of the upper and lower memory cell arrays in response to an address signal;
  a reference voltage generator configured to receive a bitline voltage from the upper memory cell array and a bitline voltage from the lower memory cell array, configured to select one of the upper memory cell array and the lower memory cell array and configured to output the bitline voltage of the selected memory cell array as a sensing voltage and to output the bitline voltage of an unselected memory cell array as a reference voltage according to the array select signal; and a differential sense amplifier configured to receive the sensing voltage and the reference voltage and configured to amplify and output a difference between the sensing voltage and the reference voltage, wherein logic states of the sensing voltage and the reference voltage are complementary to each other.

11. The memory device of claim 10, wherein the reference voltage generator adjusts a level of the bitline voltage of the unselected memory cell according to a level of the bitline voltage of the selected memory cell array and outputs the adjusted bitline voltage as the reference voltage.

12. The memory device of claim 11, wherein the address decoder outputs an upper select signal indicating whether the upper memory cell array is selected and a lower select signal indicating whether the lower memory cell array is selected, and wherein logic states of the upper and lower select signals are complementary to each other.

13. The memory device of claim 12, wherein the reference voltage generator comprises:

a first voltage output unit configured to receive the bitline voltage of the upper memory cell and the upper select signal and configured to output the bitline voltage of the upper memory cell array as the sensing voltage or the reference voltage according to the upper select signal and the bitline voltage of the lower memory cell array; and a second voltage output unit configured to receive the bitline voltage of the lower memory cell and the lower select signal and configured to output the bitline voltage of the lower memory cell array as the sensing voltage or the reference voltage according to the lower select signal and the bitline voltage of the upper memory cell array.

14. The memory device of claim 13, wherein the first voltage output unit outputs the bitline voltage of the upper memory cell array as the sensing voltage when the upper select signal is logic high and outputs a logic-high or logic-low reference voltage according to a level of the bitline voltage of the lower memory cell array when the upper select signal is logic low.

15. The memory device of claim 14, wherein the second voltage output unit outputs the bitline voltage of the lower memory cell array as the sensing voltage when the lower select signal is logic high and outputs a logic-high or logic-low reference voltage according to a level of the bitline voltage of the upper memory cell array when the lower select signal is logic low.

16. A memory device comprising:

a first memory cell array comprising memory cells of a single-ended bitline structure and configured to output a first bitline voltage;

a second memory cell array comprising memory cells of a single-ended bitline structure and configured to output a second bitline voltage;

a reference voltage generator configured to receive the first bitline voltage from the first memory cell array and the second bitline voltage from the second memory cell array, configured to select one of the first bitline voltage and the second bitline voltage and configured to output a selected one of the first and second bitline voltages as a sensing voltage according to an array select signal and to output an unselected one of the first and second bitline voltages as a reference voltage after adjusting the bitline voltage of an other of the first and second bitline voltages according to the selected one of the first and second bitline voltages; and a differential sense amplifier configured to receive the sensing voltage and the reference voltage and configured to amplify and output a difference between the sensing voltage and the reference voltage.

17. The memory device of claim 16, wherein logic states of the sensing voltage and the reference voltage are complementary to each other.

18. The memory device of claim 17, wherein the array select signal includes a first select signal indicating whether the first memory cell array is selected and a second select signal indicating whether the second memory cell array is selected, and wherein logic states of the first and second select signals are complementary to each other.

19. The memory device of claim 18, wherein the reference voltage generator comprises:

a first voltage output unit configured to receive the first bitline voltage and the first select signal and configured to output the first bitline voltage as the sensing voltage or the reference voltage according to the first select signal and the second bitline voltage; and a second voltage output unit configured to receive the second bitline voltage and the second selected signal and configured to output the second bitline voltage as the sensing voltage or the reference voltage according to the second select signal and the first bitline voltage.

20. The memory device of claim 19, wherein the first voltage output unit outputs the first bitline voltage as a sensing voltage when the first select signal is logic high and outputs a logic-high or logic-low reference voltage according to a level of the second bitline voltage when the first select signal is logic low, and wherein the second voltage output unit outputs the second bitline voltage as the sensing voltage when the second select signal is logic high and outputs a logic-high or logic-low reference voltage according to a level of the first bitline voltage when the lower select signal is logic low.

* * * * *